(12) United States Patent
Klekotka

(10) Patent No.: US 6,898,558 B2
(45) Date of Patent: May 24, 2005

(54) METHOD AND APPARATUS FOR MONITORING A MATERIAL PROCESSING SYSTEM

(75) Inventor: James E. Klekotka, Mesa, AZ (US)

(73) Assignee: Tokyo Electron Limited, Tokyo (JP)

( * ) Notice: Subject to any disclaimer, the term of this patent is extended or adjusted under 35 U.S.C. 154(b) by 52 days.

(21) Appl. No.: 10/331,587

(22) Filed: Dec. 31, 2002

(65) Prior Publication Data

US 2004/0128021 A1 Jul. 1, 2004

(51) Int. Cl.$^7$ .............................. G06F 19/00
(52) U.S. Cl. ................. 702/188; 702/130; 702/127; 156/345.24; 438/14
(58) Field of Search ............................ 702/188, 22–25, 702/30–32, 45, 47, 50, 55, 63, 114, 115, 124, 126, 127, 130, 136, 138, 146, 183, 187, 189, 198; 700/108, 119–121; 438/5, 8–10, 14, 17, 11, 18, 726, 710, 714, 716; 156/345.24–345.29, 345.13–345.15, 345.48, 915; 118/712, 723 MW, 723 E; 216/59, 61, 84, 86; 73/61.62, 865.9; 427/8, 10; 204/298.03

(56) References Cited

U.S. PATENT DOCUMENTS

| | | | | |
|---|---|---|---|---|
| 6,244,121 B1 | * | 6/2001 | Hunter | 73/865.9 |
| 6,455,437 B1 | * | 9/2002 | Davidow et al. | 438/710 |
| 6,617,963 B1 | * | 9/2003 | Watters et al. | 340/10.41 |
| 6,668,618 B2 | * | 12/2003 | Larson et al. | 73/24.01 |
| 2003/0032207 A1 | * | 2/2003 | Rengarajan et al. | 438/14 |
| 2003/0082835 A1 | * | 5/2003 | McChesney et al. | 438/10 |
| 2003/0201069 A1 | * | 10/2003 | Johnson | 156/345.43 |
| 2003/0231566 A1 | * | 12/2003 | Smith et al. | 369/47.25 |
| 2004/0007326 A1 | * | 1/2004 | Roche et al. | 156/345.24 |
| 2004/0029299 A1 | * | 2/2004 | Pasadyn et al. | 438/5 |

* cited by examiner

*Primary Examiner*—Hal Wachsman
(74) *Attorney, Agent, or Firm*—Oblon, Spivak, McClelland, Maier & Neustadt, P.C.

(57) ABSTRACT

The present invention presents an apparatus and method for monitoring a material processing system, wherein the material processing system includes a processing tool, a number of RF-responsive process sensors coupled to the processing tool to generate and transmit process data, and a sensor interface assembly (SIA) configured to receive the process data from the plurality of RF-responsive process sensors.

81 Claims, 14 Drawing Sheets

METHOD AND APPARATUS FOR MONITORING A MATERIAL PROCESSING SYSTEM

CROSS-REFERENCE TO RELATED APPLICATIONS

This application is related to co-pending application Ser. No. 10/331,330, filed on even date herewith, entitled "Method and Apparatus for Monitoring a Material Processing System"; Ser. No. 10/331,332, filed on even date herewith, entitled "Method and Apparatus for Monitoring a Material Processing System"; Ser. No. 10/331,340, filed on even date herewith, entitled "Method and Apparatus for Monitoring Parts in a Material Processing System"; and Ser. No. 10/331,341, filed on even date herewith, entitled "Method and Apparatus for Monitoring a Plasma in a Material Processing System". The entire contents of each of these applications are herein incorporated by reference.

FIELD OF THE INVENTION

The present invention relates to monitoring a process in a processing system and, more particularly, to monitoring a process using a monitoring device having an integral transmission device.

BACKGROUND OF THE INVENTION

The fabrication of integrated circuits (IC) in the semiconductor industry typically employs plasma to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

During, for example, an etch process, monitoring the plasma processing system can be very important when determining the state of a plasma processing system and determining the quality of devices being produced. Additional process data can be used to prevent erroneous conclusions regarding the state of the system and the state of the products being produced. For example, the continuous use of a plasma processing system can lead to a gradual degradation of the plasma processing performance and ultimately to complete failure of the system. Additional process related data and tool related data will improve the management of a material processing system and the quality of the products being produced.

SUMMARY OF THE INVENTION

The present invention provides an apparatus and method for monitoring a process in a processing system and, more particularly, to a process monitoring device having an integral transmission device and a method for monitoring a process in a processing system using a process monitoring device having an integral transmission device.

The present invention also provides an apparatus and method for monitoring a plasma process in a material processing system and, more particularly, to a plasma monitoring device having an integral transmission device and a method for monitoring a plasma process in a material processing system using a plasma monitoring device having an integral transmission device.

The present invention also provides a means for monitoring a process in a material processing system that includes at least one RF-responsive sensor coupled to at least one sensor interface assembly (SIA).

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

The present invention provides an improved material processing system that can include a processing tool, which can comprise one or more process chambers. In addition, the processing system can include a plurality of RF-responsive process sensors that are coupled to the processing tool to generate and transmit process data and at least one SIA configured to receive the process data from at least one of the plurality of RF-responsive process sensors.

Figure 1:
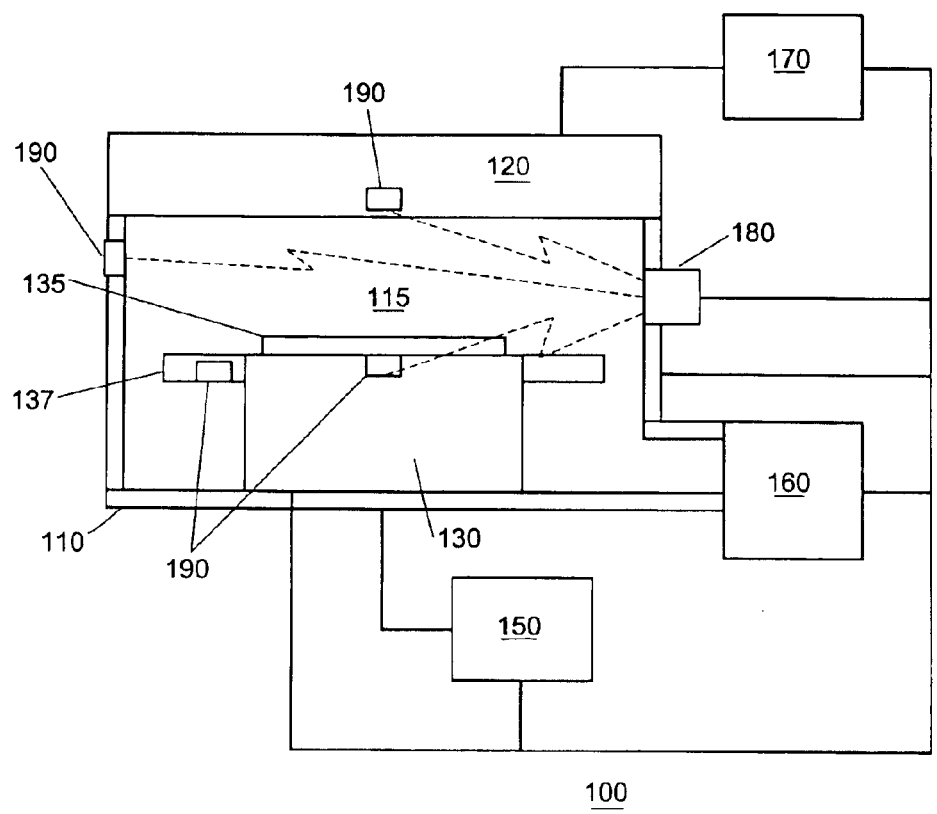
FIG. 1 illustrates a simplified block diagram for a material processing system in accordance with an embodiment of the present invention.

FIG. 1 illustrates a simplified block diagram for a material processing system in accordance with an embodiment of the present invention. For example, material processing system 100 can comprise an etch system, such as an plasma etcher. Alternately, material processing system 100 can comprise a photoresist coating system such as a photoresist spin coating system, and/or material processing system 100 can comprise a photoresist patterning system such as a lithography system. In another embodiment, material processing system 100 can comprise a dielectric coating system such as a spin-on-glass (SOG) or spin-on-dielectric (SOD) system. In another embodiment, material processing system 100 can comprise a deposition chamber such as a chemical vapor deposition (CVD) system, a physical vapor deposition (PVD) system, a atomic layer deposition (ALD) system, and/or combinations thereof. In an additional embodiment, material processing system 100 can comprise a thermal processing system such as a rapid thermal processing (RTP) system. In another embodiment, material processing system 100 can comprises a batch diffusion furnace or other semiconductor processing system.

In the illustrated embodiment, material processing system 100 comprises processing chamber 110, upper assembly 120, substrate holder 130 for supporting substrate 135, pumping system 160, and controller 170. For example, pumping system 160 can provide a controlled pressure in processing chamber 110. For example, processing chamber 110 can facilitate the formation of a processing gas in a process space 115 adjacent substrate 135. The material processing system 100 can be configured to process 200 mm substrates, 300 mm substrates, or larger substrates. Alternately, the material processing system can operate by generating plasma in one or more processing chambers.

Substrate 135 can be, for example, transferred into and out of processing chamber 110 through a slot valve (not shown) and chamber feed-through (not shown) via robotic substrate transfer system where it can be received by substrate lift pins (not shown) housed within substrate holder 130 and mechanically translated by devices housed therein. Once substrate 135 is received from substrate transfer system, it can be lowered to an upper surface of substrate holder 130.

Substrate 135 can be, for example, affixed to the substrate holder 130 via an electrostatic clamping system. Furthermore, substrate holder 130 can further include a cooling system including a re-circulating coolant flow that receives heat from substrate holder 130 and transfers heat to a heat exchanger system (not shown), or when heating, transfers heat from the heat exchanger system. Moreover, gas can, for example, be delivered to the backside of substrate 135 via a backside gas system to improve the gas-gap thermal conductance between substrate 135 and substrate holder 130. Such a system can be utilized when temperature control of the substrate is required at elevated or reduced temperatures. In other embodiments, heating elements, such as resistive heating elements, or thermo-electric heaters/coolers can be included.

In alternate embodiments, substrate holder 130 can, for example, further comprise a vertical translation device (not shown) that can be surrounded by a bellows (not shown) coupled to the substrate holder 130 and the processing chamber 110, and configured to seal the vertical translation device from the reduced pressure atmosphere in processing chamber 110. Additionally, a bellows shield (not shown) can, for example, be coupled to the substrate holder 130 and configured to protect the bellows. Substrate holder 130 can, for example, further provide a focus ring (not shown), a shield ring (not shown), and a baffle plate 137.

In the illustrated embodiment, shown in FIG. 1, substrate holder 130 can comprise an electrode (not shown) through which RF power can be coupled to the processing plasma in process space 115. For example, substrate holder 130 can be electrically biased at a RF voltage via the transmission of RF power from RF system 150. The RF bias can serve to heat electrons to form and maintain plasma. In this configuration, the material system can operate as a reactive ion etch (RIE) reactor, wherein the chamber and upper gas injection electrode serve as ground surfaces. A typical frequency for the RF bias can range from 1 MHz to 100 MHz. For example, semiconductor processing systems that use 13.56 MHz for plasma processing are well known to those skilled in the art.

As shown in FIG. 1, upper assembly 120 can be coupled to the processing chamber 110 and configured to perform at least one of the following functions: provide a gas injection system, provide a capacitively coupled plasma (CCP) source, provide an inductively coupled plasma (ICP) source, provide a transformer-coupled plasma (TCP) source, provide a microwave powered plasma source, provide an electron cyclotron resonance (ECR) plasma source, provide a Helicon wave plasma source, and provide a surface wave plasma source.

For example, upper assembly 120 can comprise an electrode, an insulator ring, an antenna, a transmission line, and/or other RF components (not shown). In addition, upper assembly 120 can comprise permanent magnets, electromagnets, and/or other magnet system components (not shown). Also, upper assembly 120 can comprise supply lines, injection devices, mass flow controllers, and/or other gas supply system components (not shown). Furthermore, upper assembly 120 can comprise a housing, a cover, sealing devices, and/or other mechanical components (not shown).

In an alternate embodiment, processing chamber 110 can, for example, further comprise a chamber liner (not shown) or process tube (not shown) for protecting the processing chamber 110 from a processing plasma in the process space 115. In addition, processing chamber 110 can comprise a monitoring port (not shown). A monitoring port can, for example, permit optical monitoring of process space 115.

Material processing system 100 also comprises at least one measuring device having an integral transmission means. As shown in the illustrated embodiment, at least one RF-responsive process sensor 190 can be used to generate and transmit data such as process data. For example, chamber 110 can comprise at least one RF-responsive process sensor 190, and/or upper assembly 120 can comprise at least one RF-responsive process sensor 190, and/or substrate holder can comprise at least one RF-responsive process sensor 190. The RF-responsive process sensor 190 can also be coupled to a plate such as any one of an exhaust plate, a baffle plate, an electrode plate, an insulator plate and an injection plate.

Material processing system 100 also comprises at least one interface device having an integral reception means. As shown in FIG. 1, a sensor interface assembly (SIA) 180 can be used to communicate with at least one RF-responsive process sensor 190. For example, SIA 180 can receive the process data.

In one embodiment, RF-responsive process sensor 190 can comprise a process sensor (not shown) and an integral transmitter (not shown), and SIA 180 can comprise an integral receiver (not shown). RF-responsive process sensor 190 can use the transmitter to send data, and the SIA 180 can use the receiver to receive the transmitted data. RF-responsive process sensors 190 can operate using the same or different frequencies, and SIA 180 can operate using one or more frequencies.

Material processing system 100 also comprises a controller 170. Controller 170 can be coupled to chamber 110, upper assembly 120, substrate holder 130, RF system 150, pumping system 160, and SIA 180. The controller can be configured to provide control data to the SIA and receive data such as process data from the SIA. For example, controller 170 can comprise a microprocessor, a memory (e.g., volatile and/or non-volatile memory), and a digital I/O port capable of generating control voltages sufficient to communicate and activate inputs to the processing system 100 as well as monitor outputs from the processing system 100. Moreover, the controller 170 can exchange information with chamber 110, upper assembly 120, substrate holder 130, RF system 150, pumping system 160, and SIA 180. Also, a program stored in the memory can be utilized to control the aforementioned components of a material processing system 100 according to a process recipe. In addition, controller 170 can be configured to analyze the process data, to compare the process data with target process data, and to use the comparison to change a process and/or control the processing tool. Also, the controller can be configured to analyze the process data, to compare the process data with historical process data, and to use the comparison to predict, prevent, and/or declare a fault.

Figure 2:
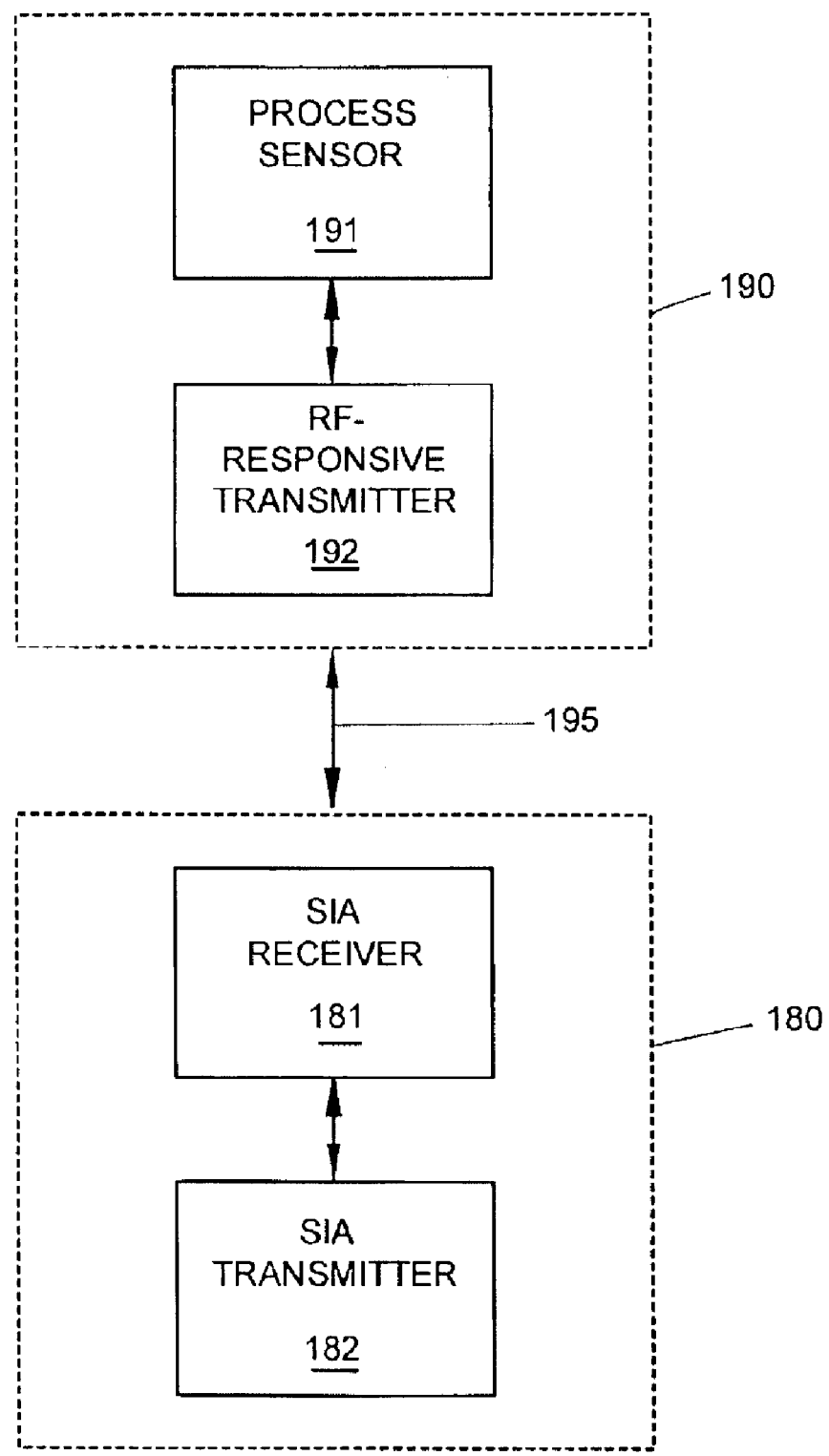
FIG. 2 shows a simplified block diagram of a RF-responsive process sensor and a sensor interface assembly (SIA) in accordance with an embodiment of the present invention.

FIG. 2 shows a simplified block diagram of a RF-responsive process sensor and a SIA in accordance with an embodiment of the present invention. In the illustrated embodiment, SIA 180 comprises SIA receiver 181 and SIA transmitter 182, and RF-responsive process sensor 190 comprises process sensor 191 and RF-responsive transmitter 192.

SIA 180 can be coupled to RF-responsive process sensor 190 using communications link 195. For example, RF-responsive process sensor 190 and SIA 180 can operate using one or more RF frequencies in the range from 0.01 MHz to 110.0 GHz. Alternately, communications link 195 can comprise optical means.

SIA receiver 181 can be configured to receive signals from one or more RF-responsive process sensors. For example, SIA receiver 181 can be configured to receive a response signal from at least one RF-responsive process sensor, and the response signal can comprise data, which can include process data.

In addition, SIA transmitter 182 can be configured to transmit signals to one or more RF-responsive process sensors. For example, SIA transmitter 182 can be configured to transmit an input signal to at least one RF-responsive process sensor, and the input signal can comprise data, which can include control data.

Process sensor 191 can be configured to provide one or more component related properties. Process sensor 191 can be configured to generate process data and to provide the process data to a RF-responsive transmitter 192. Process data can comprise at least one of temperature data, pressure data, and process chemistry data. For example, process sensor 191 can be coupled to a system component and can be configured to generate process data that can comprise at least one of temperature data, pressure data, and process chemistry data. Process chemistry data can include flow rates, flow times, and/or gas species data. Process data can comprise measured and/or processed data that can be used to control a process, process chamber, and/or processing tool.

In various embodiments, process sensor 191 can comprise at least one of a temperature sensor, a pressure sensor, a flow sensor, and a mass flow controller. For example, a temperature sensor can comprise at least one of a thermocouple, thermistor, thermometer, pyrometer, microelectromechanical (MEM), RTD, and other semiconductor devices. A temperature sensor can be coupled to a system component and can be configured to generate temperature data. A pressure sensor can comprise at least one of a manometer, MEM device, and pressure transducer. A flow sensor can comprise at least one of a mass flow sensor, a differential transducer, electromagnetic sensor, ultrasonic sensor, optical sensor, and MEM sensor. In addition, a SAW, BAW, MEM resonators can be used to generate process data. In addition, the sensors can measure, store, and/or analyze process data.

Alternately, process sensor 191 can further comprise at least one of a power source, receiver, transmitter, controller, timer, memory (e.g., volatile and/or non-volatile memory), and a housing.

Process sensor 191 can be configured to generate process data for long periods of time or for short periods of time. For example, a process sensor can comprise at least one of a continuously running timer and a triggered timer, and a triggered timer can be triggered by a process related event or a non-process related event. A process sensor can convert RF energy into a DC signal and use the DC signal to operate the sensor. In this manner, process related data, such as RF hours data, can be generated.

RF-responsive transmitter 192 can be configured to transmit signals to at least one SIA 180. For example, RF-responsive transmitter 192 can be configured to transmit a response signal, and the response signal can comprise data, which can include process data and/or erosion data. Also, the transmitter can be used to process and transmit narrowband and wideband signals including AM signals, FM signals, and/or PM signals. In addition, the transmitter can also process and/or transmit coded signals and/or spread spectrum signals to increase its performance within a high interference environment such as a semiconductor processing facility.

In various embodiments, RF-responsive transmitter 192 can comprise at least one of a power source, a signal source, a modulator, a coder, an amplifier, an antenna, a memory (e.g., volatile and/or non-volatile memory), a housing, and a controller. In one case, RF-responsive transmitter 192 can comprise an antenna (not shown) that is used as a backscattering device when placed within a RF field.

In alternate embodiments, RF-responsive process sensor 190 can further comprise at least one of a power source, signal source, receiver, antenna, memory (e.g., volatile and/or non-volatile memory), timer, housing; and controller. Also, RF-responsive process sensor 190 can further comprise sensors such as described in co-pending application Ser. No. 10/331,330, Attorney Docket No. 231749US6YA, filed on even date herewith, entitled "Method and Apparatus for Monitoring a Material Processing System"; Ser. No. 10/331,332, Attorney Docket No. 23175US6YA, filed on even date herewith, entitled "Method and Apparatus for Monitoring a Material Processing System"; and Ser. No. 10/331,341, Attorney Docket No. 231227US6YA, filed on even date herewith, entitled "Method and Apparatus for Monitoring Parts in a Material Processing System"; and Ser. No. 10/331,341, Attorney Docket No. 231228US6YA, filed on even date herewith, entitled "Method and Apparatus for Monitoring a Plasma in a Material Processing System", all of which are incorporated by reference herein.

Figure 3A:
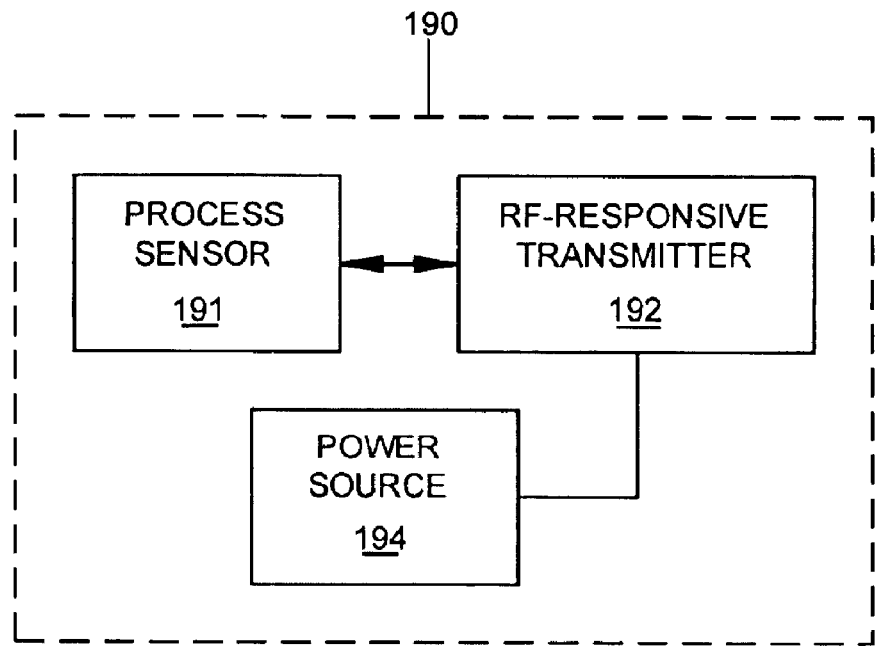
FIGS. 3a–3c show simplified block diagrams of a RF-responsive process sensor in accordance with embodiments of the present invention.
Figure 3B:
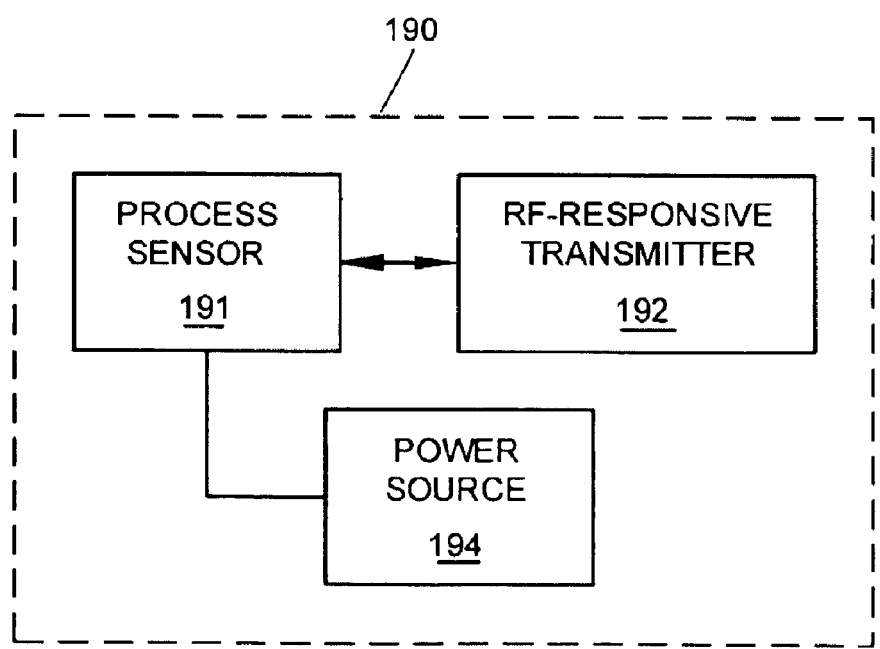
Figure 3C:
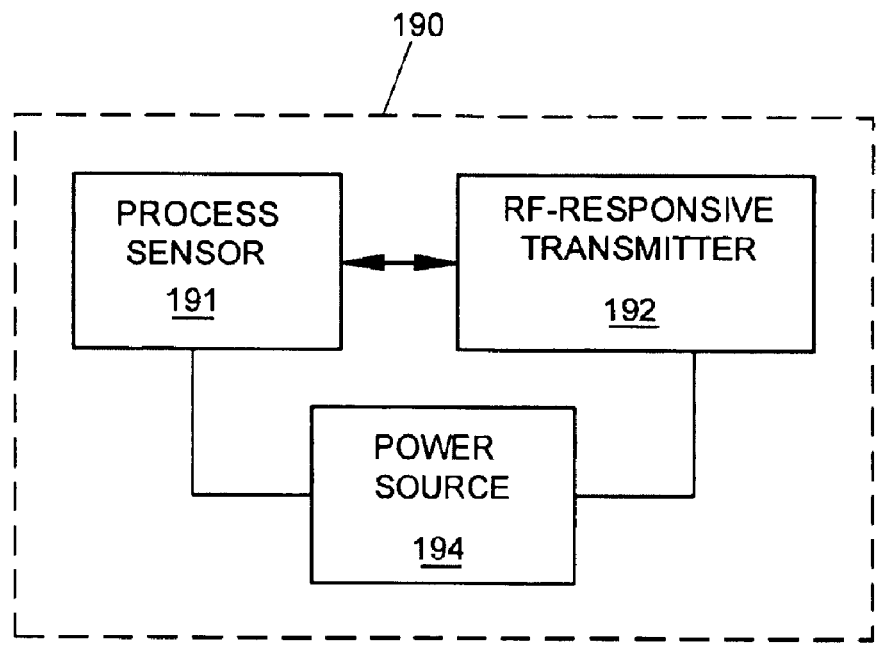

FIGS. 3a–3c show simplified block diagrams of a RF-responsive process sensor in accordance with embodiments of the present invention. In the illustrated embodiments, RF-responsive process sensor 190 comprises process sensor 191, RF-responsive transmitter 192, and power source 194.

As shown in FIG. 3a, power source 194 can be coupled to RF-responsive transmitter 192. Alternately, power source 194 can be incorporated within RF-responsive transmitter 192. As shown in FIG. 3b, power source 194 can be coupled to process sensor 191. Alternately, power source 194 can be incorporated within process sensor 191. As shown in FIG. 3c, power source 194 can be coupled to process sensor 191 and RF-responsive transmitter 192. Alternately, power source 194 can be incorporated within process sensor 191 and within RF-responsive transmitter 192.

Power source 194 can comprise at least one of a RF-to-DC converter, a DC-to-DC converter, and a battery. For example, RF-to-DC converter can comprise at least one of an antenna, diode, and filter. In one case, a RF-to-DC converter can convert at least one process related frequency into a DC signal. In another case, a RF-to-DC converter can convert at least one non-process related frequency into a DC signal. For instance, an external signal can be provided to the converter. Alternately, a RF-to-DC converter can convert at least one plasma related frequency into a DC signal.

Figure 4A:
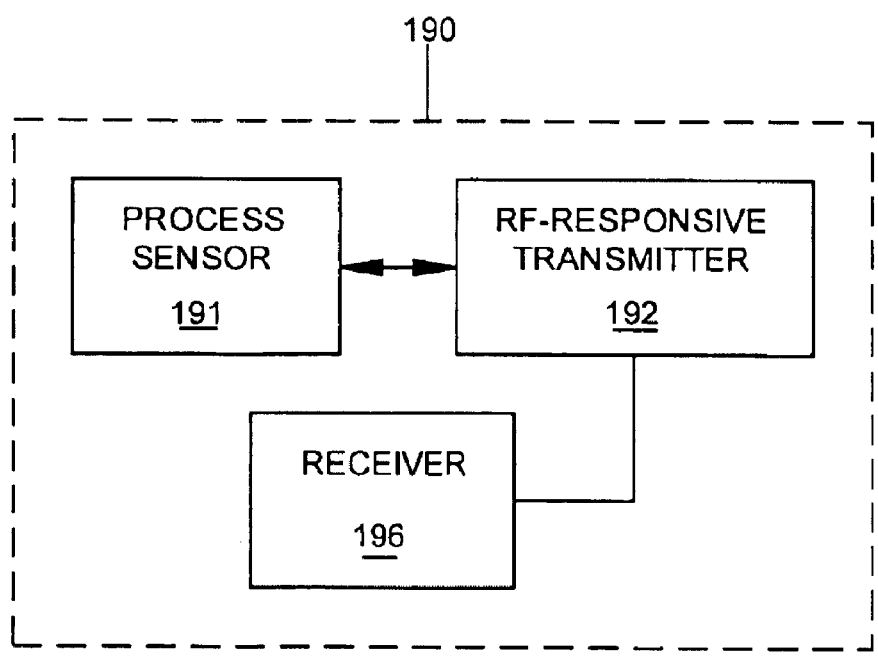
FIGS. 4a–4c show simplified block diagrams of a RF-responsive process sensor in accordance with additional embodiments of the present invention.
Figure 4B:
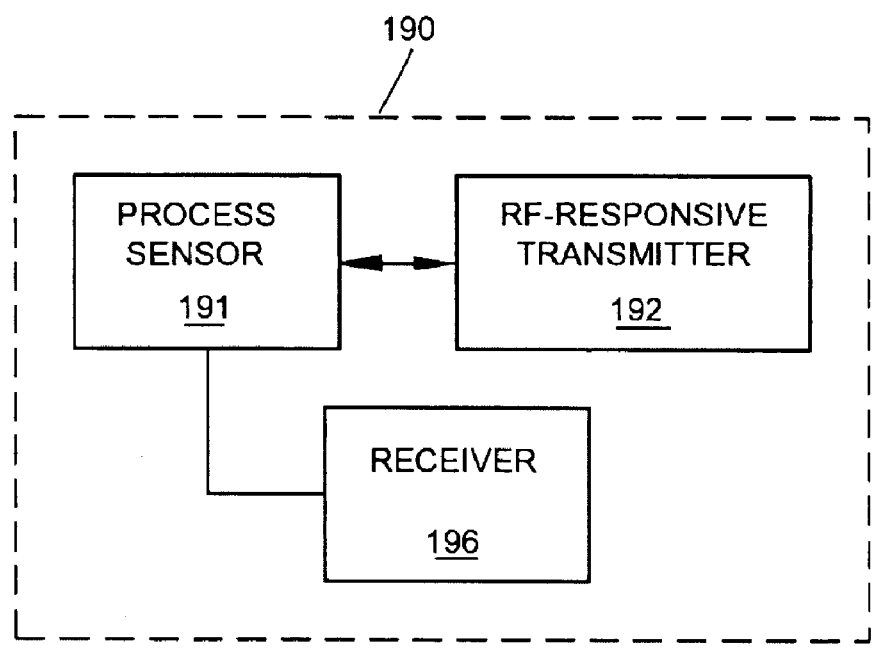
Figure 4C:
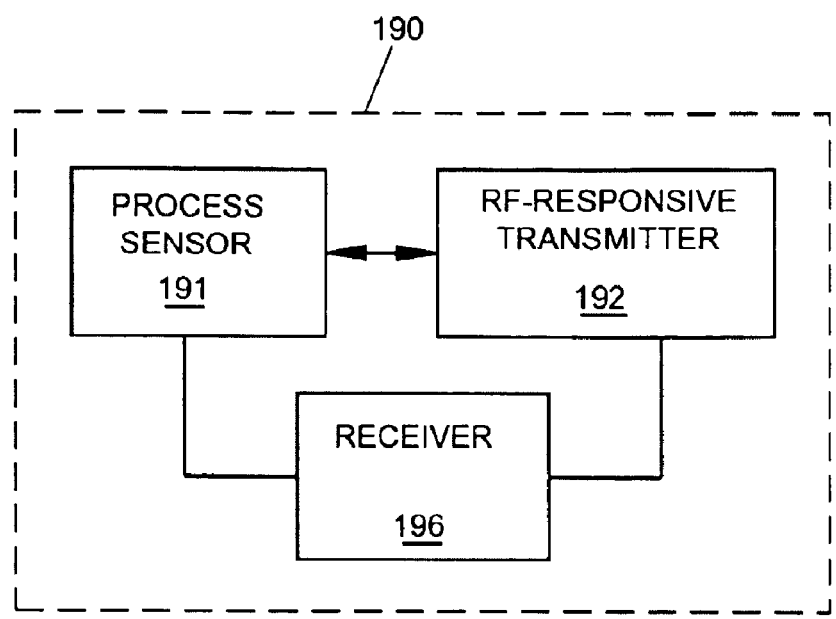

FIGS. 4a–4c show simplified block diagrams of a RF-responsive process sensor in accordance with additional embodiments of the present invention. In the illustrated embodiments, RF-responsive process sensor 190 comprises process sensor 191, RF-responsive transmitter 192, and receiver 196.

As shown in FIG. 4a, receiver 196 can be coupled to RF-responsive transmitter 192. Alternately, receiver 196 can be incorporated within RF-responsive transmitter 192. As shown in FIG. 4b, receiver 196 can be coupled to process sensor 191. Alternately, receiver 196 can be incorporated within process sensor 191. As shown in FIG. 4c, receiver 196 can be coupled to process sensor 191 and RF-responsive transmitter 192. Alternately, receiver 196 can be incorporated within process sensor 191 and within RF-responsive transmitter 192.

Receiver 196 can comprise at least one of a power source, signal source, antenna, down converter, demodulator, decoder, controller, memory (e.g., volatile and/or non-volatile memory), and converters. For example, the receiver can be used to receive and process narrowband and wideband signals including AM signals, FM signals, and/or PM signals. In addition, the receiver can also receive and process coded signals and/or spread spectrum signals to increase its performance within a high interference environment such as a semiconductor processing facility.

Figure 5A:
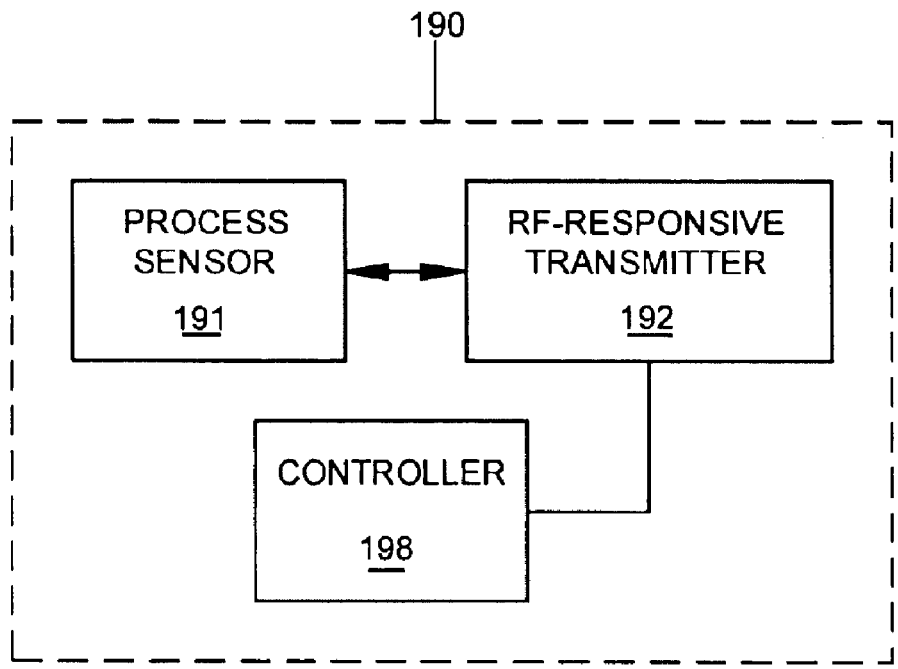
FIGS. 5a–5c show simplified block diagrams of a RF-responsive process sensor in accordance with additional embodiments of the present invention.
Figure 5B:
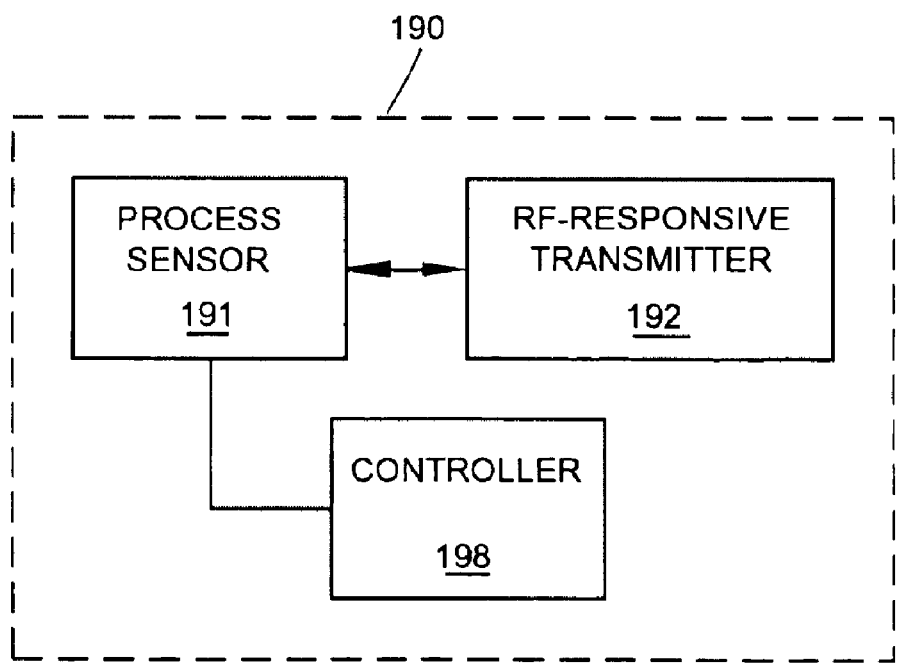
Figure 5C:
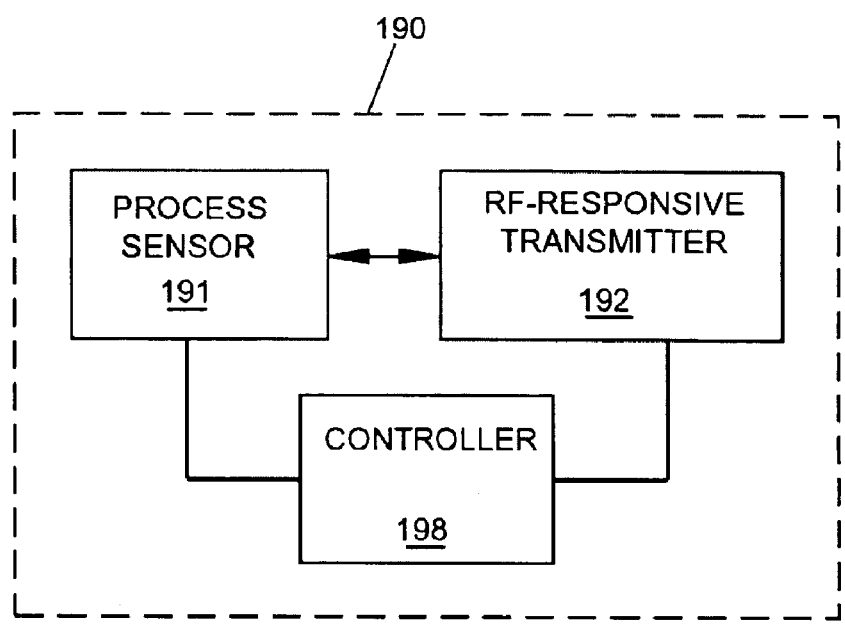

FIGS. 5a–5c show simplified block diagrams of a RF-responsive process sensor in accordance with additional embodiments of the present invention. In the illustrated embodiments, RF-responsive process sensor 190 comprises process sensor 191, RF-responsive transmitter 192, and controller 198.

As shown in FIG. 5a, controller 198 can be coupled to RF-responsive transmitter 192. Alternately, controller 198 can be incorporated within RF-responsive transmitter 192. As shown in FIG. 5b, controller 198 can be coupled to process sensor 191. Alternately, controller 198 can be incorporated within process sensor 191. As shown in FIG. 5c, controller 198 can be coupled to process sensor 191 and RF-responsive transmitter 192. Alternately, controller 198 can be incorporated within process sensor 191 and within RF-responsive transmitter 192.

Controller 198 can comprise at least one of a receiver, microprocessor, microcontroller, timer, digital signal processor (DSP), memory (e.g., volatile and/or non-volatile memory), A/D converter, and D/A converter. For example, the controller can be used to process data received from AM signals, FM signals, and/or PM signals and can be used to process data to be transmitted on AM signals, FM signals, and/or PM signals. In addition, controller 198 can be used to process coded and/or spread spectrum signals. Also, controller 198 can be used to store information such as measured data, instructional code, sensor information, and/or part information, which can include sensor identification and part identification data. For instance, input signal data can be provided to controller 198.

Figure 6A:
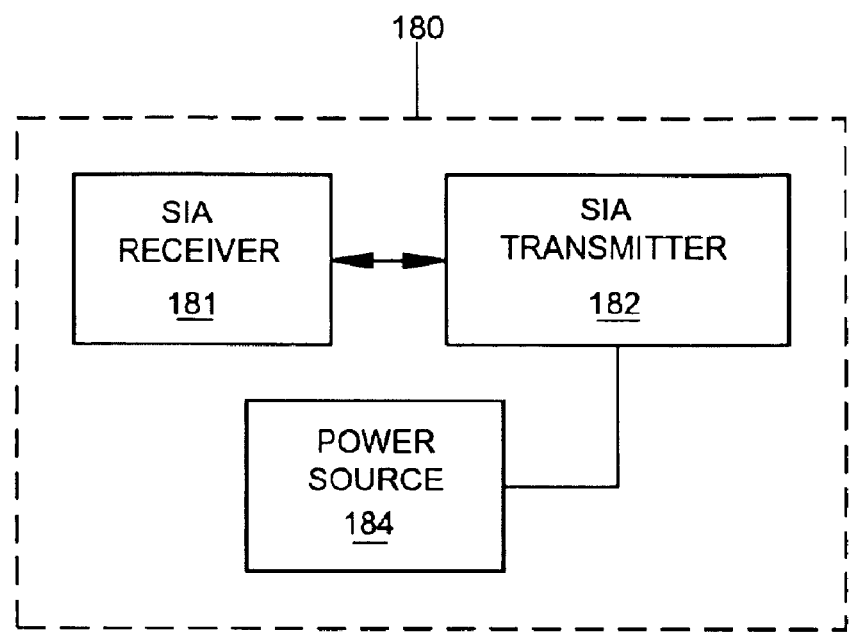
FIGS. 6a–6c show simplified block diagrams of a sensor interface assembly in accordance with embodiments of the present invention.
Figure 6B:
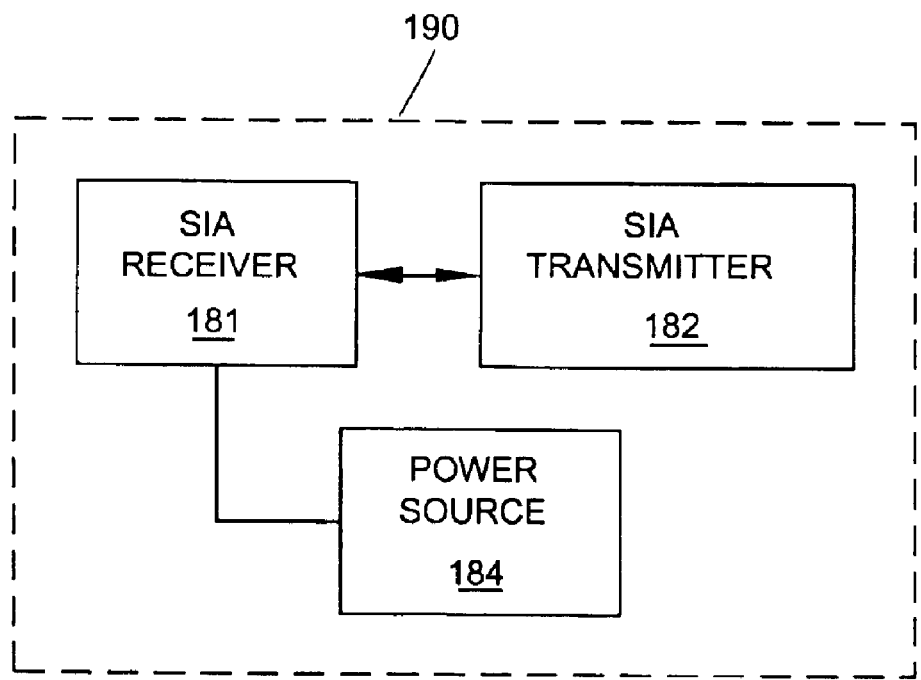
Figure 6C:
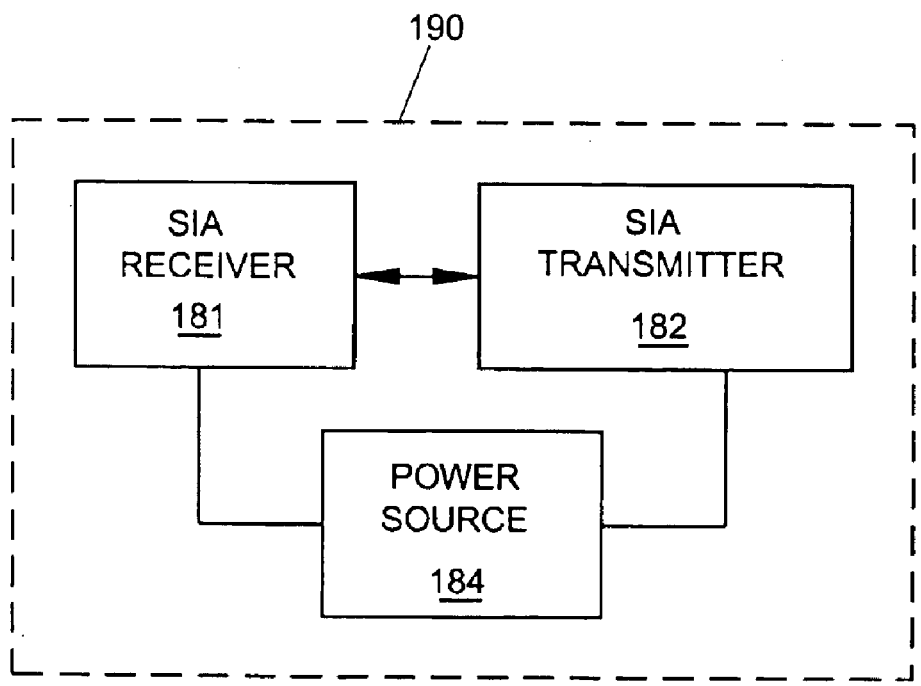

FIGS. 6a–6c show simplified block diagrams of a SIA in accordance with embodiments of the present invention. In the illustrated embodiments, SIA 180 comprises SIA receiver 181, SIA transmitter 182, and power source 184.

SIA transmitter 182 can be configured to transmit an input signal to at least one RF-responsive process sensor, and the at least one RF-responsive process sensor can use the input signal to control its operation. For example, a RF-responsive process sensor can use the input signal information to determine when to generate process data and/or when to transmit a response signal.

SIA transmitter 182 can comprise at least one of a power source, signal source, antenna, up converter, modulator, coder, timer, controller, memory (e.g., volatile and/or non-volatile memory), a D/A converter, and an A/D converter. For example, the transmitter can be used to process and transmit narrowband and wideband signals including AM signals, FM signals, and/or PM signals. In addition, SIA transmitter 182 can be configured to process and transmit coded signals and/or spread spectrum signals to increase performance within a high interference environment such as a semiconductor processing facility.

SIA receiver 181 can be configured to receive a response signal from at least one RF-responsive process sensor, and the response signal can comprise data such as process data.

SIA receiver 181 can comprise at least one of a power source, a signal source, antenna, down converter, demodulator, decoder, timer, controller, memory (e.g., volatile and/or non-volatile memory), a D/A converter, and an A/D converter. For example, the SIA receiver can be used to receive and process narrowband and wideband signals including AM signals, FM signals, and/or PM signals. In addition, SIA receiver 181 can also be configured to receive and process coded signals and/or spread spectrum signals to increase performance within a high interference environment such as a semiconductor processing facility.

As shown in FIG. 6a, power source 184 can be coupled to SIA transmitter 182. Alternately, power source 184 can be incorporated within SIA transmitter 182. As shown in FIG. 6b, power source 184 can be coupled to SIA receiver 181. Alternately, power source 184 can be incorporated within SIA receiver 181. As shown in FIG. 6c, power source 184 can be coupled to SIA receiver 181 and SIA transmitter 182. Alternately, power source 184 can be incorporated within SIA receiver 181 and SIA transmitter 182.

Power source 184 can comprise at least one of a RF-to-DC converter, DC-to-DC converter, a battery, filter, timer, memory (e.g., volatile and/or non-volatile memory), and a controller. In addition, the power source can be external to the chamber and coupled to the SIA using one or more cables.

Figure 7A:
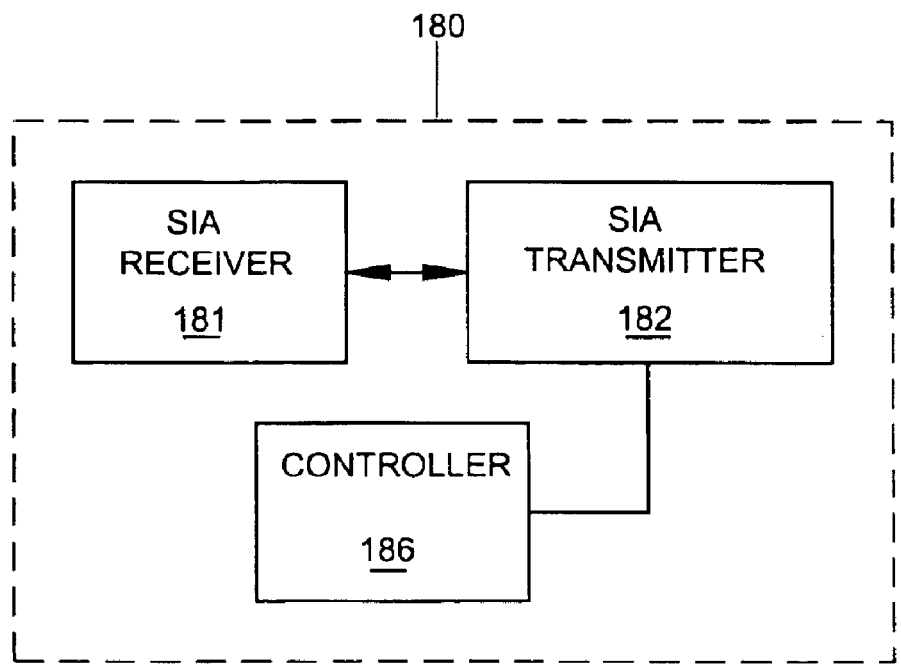
FIGS. 7a–7c show simplified block diagrams of a sensor interface assembly in accordance with additional embodiments of the present invention.
Figure 7B:
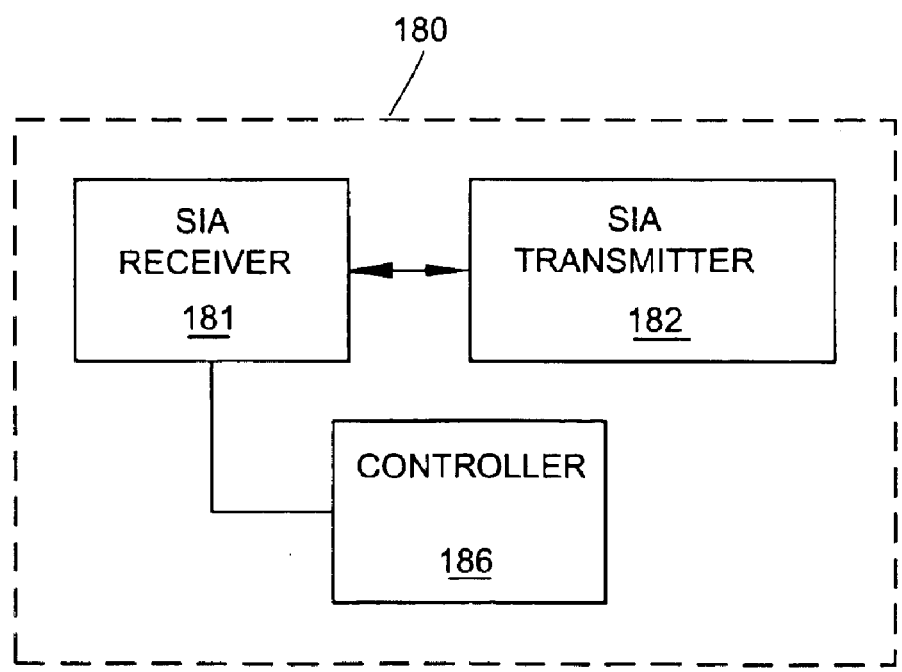
Figure 7C:
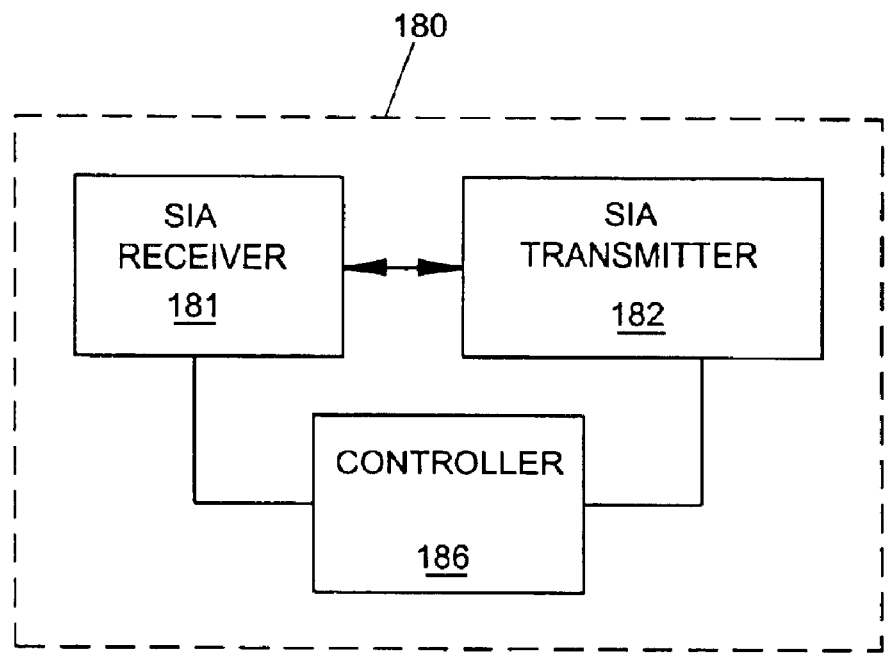

FIGS. 7a–7c show simplified block diagrams of a sensor interface assembly in accordance with additional embodiments of the present invention. In the illustrated embodiments, SIA 180 comprises SIA receiver 181, SIA transmitter 182, and controller 186.

As shown in FIG. 7a, controller 186 can be coupled to SIA receiver 181. Alternately, controller 186 can be incorporated within SIA receiver 181. As shown in FIG. 7b, controller 186 can be coupled to SIA transmitter 182. Alternately, controller 186 can be incorporated within SIA transmitter 182. As shown in FIG. 7c, controller 186 can be coupled to SIA receiver 181 and SIA transmitter 182. Alternately, controller 186 can be incorporated within SIA receiver 181 and SIA transmitter 182.

Controller 186 can comprise at least one of a microprocessor, microcontroller, digital signal processor (DSP), memory (e.g., volatile and/or non-volatile memory), A/D converter, and D/A converter. For example, the controller can be used to process data received from response signals and can be used to process data to be transmitted on input signals. Also, controller 186 can be used to store information such as measured data, instructional code, sensor information, and/or part information, which can include sensor identification and part identification data.

Figure 8A:
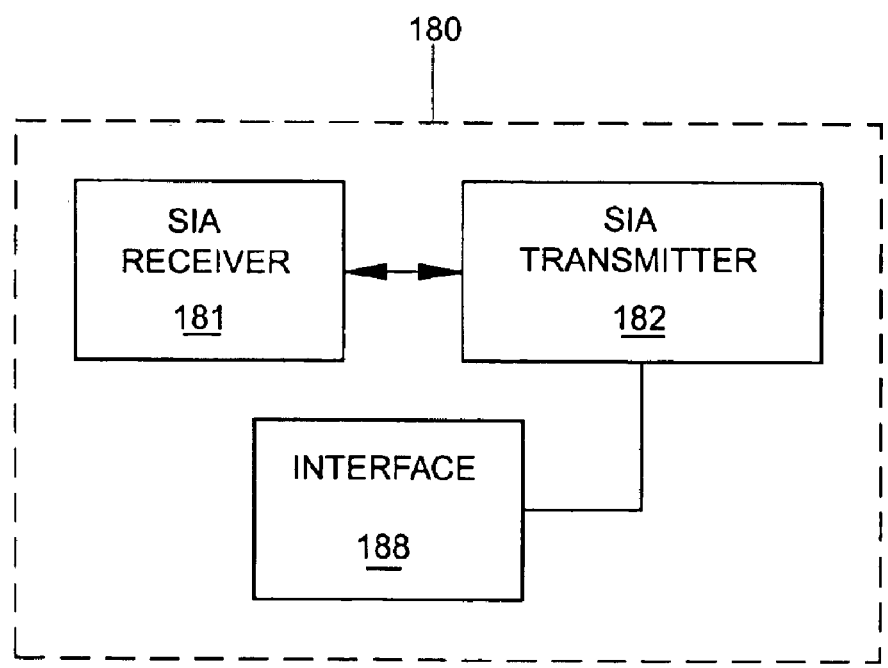
FIGS. 8a–8c show simplified block diagrams of a sensor interface assembly in accordance with additional embodiments of the present invention.
Figure 8B:
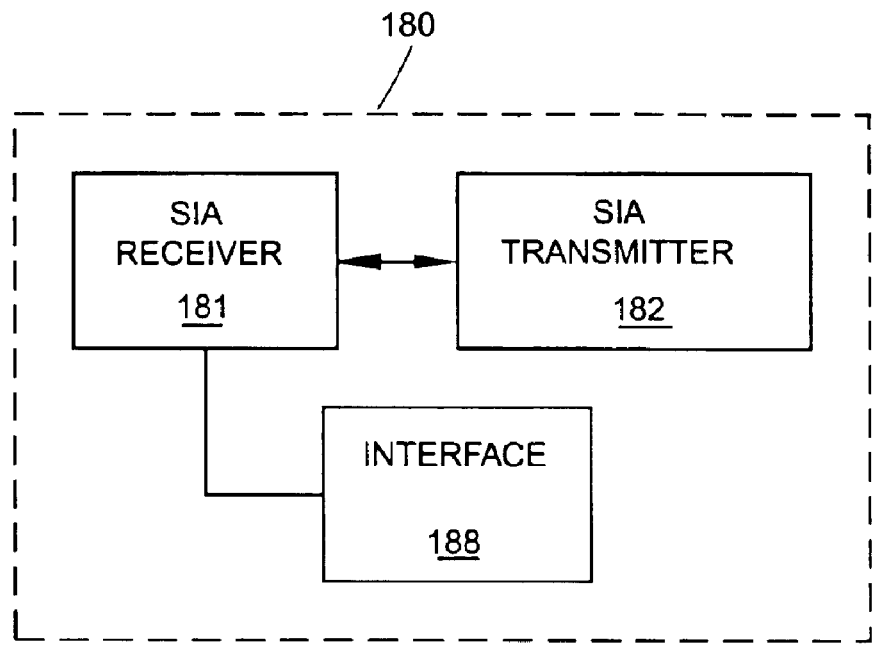
Figure 8C:
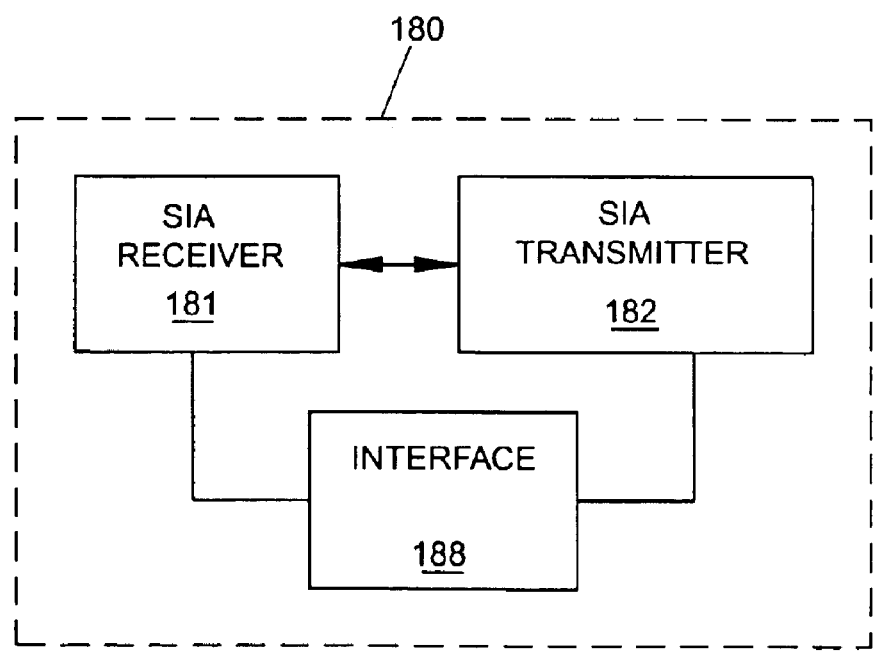

FIGS. 8a–8c show simplified block diagrams of a sensor interface assembly in accordance with additional embodiments of the present invention. In the illustrated embodiments, SIA 180 comprises SIA receiver 181, SIA transmitter 182, and interface 188.

As shown in FIG. 8a, interface 188 can be coupled to SIA receiver 181. Alternately, interface 188 can be incorporated within SIA receiver 181. As shown in FIG. 8b, interface 188 can be coupled to SIA transmitter 182. Alternately, interface 188 can be incorporated within SIA transmitter 182. As shown in FIG. 8c, interface 188 can be coupled to SIA receiver 181 and SIA transmitter 182. Alternately, interface 188 can be incorporated within SIA receiver 181 and SIA transmitter 182.

Interface 188 can comprise at least one of a power source, a signal source, a receiver, a transmitter, a controller, a processor, memory (e.g., volatile and/or non-volatile memory), a timer, and a converter. For example, the interface can be used to process data received from and sent to a system level component, such as controller 170 (FIG. 1).

Those skilled in the art will recognize that a receiver and transmitter can be combined into a transceiver.

Figure 9:
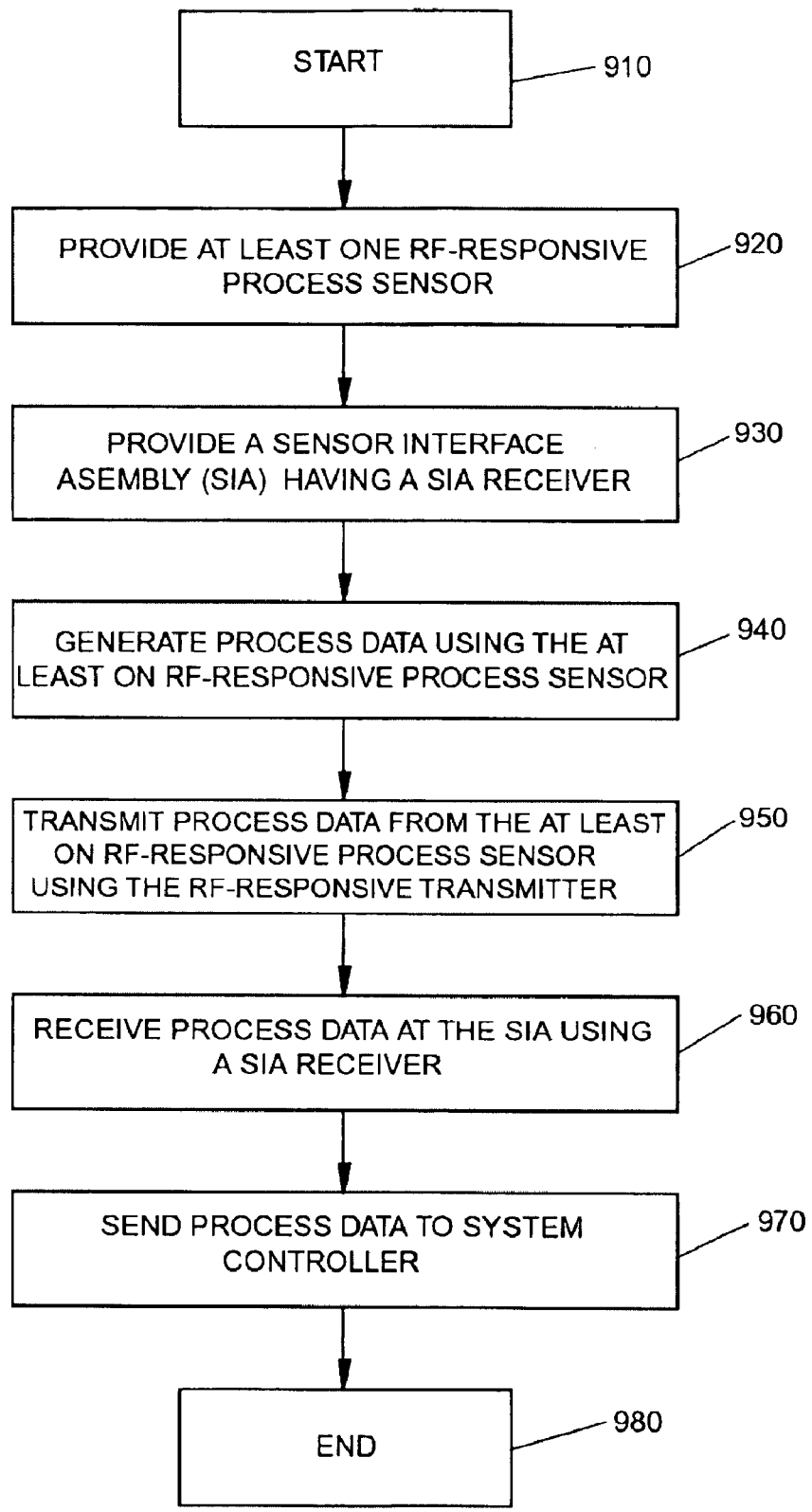
FIG. 9 illustrates a method for monitoring a material processing system according to an embodiment of the present invention.

FIG. 9 illustrates a method for monitoring a material processing system according to an embodiment of the present invention. Procedure 900 begins in 910.

In 920, at least one RF-responsive process sensor is provided. RF-responsive process sensors can be provided in a number of different locations in a material processing system. For example, RF-responsive process sensors can be coupled to chamber components, upper assembly components, and substrate holder components. Also, RF-responsive process sensors can be coupled to a chamber liner (process tube) when one is used in the material processing system. In addition, RF-responsive process sensors can be coupled to a transfer system component, a RF system component, a gas supply system component, and/or an exhaust system component when one or more of these components are used in the material processing system.

A RF-responsive process sensor can comprise an RF-responsive transmitter coupled to a process sensor. In various embodiments, process sensor can comprise at least one of a temperature sensor, pressure sensor, flow sensor, and process chemistry sensor. For example, a process sensor can be used to measure process parameters a process chamber, and/or outside of a process chamber. In addition, sensors can be coupled to components that are used to provide RF signals to a process chamber and/or processing tool.

A process sensor can be configured to generate data, such as process data, and provide the data to an RF-responsive transmitter. Also, a process sensor can comprise at least one of a processor, memory (e.g., volatile and/or non-volatile memory), timer, and power source, and a process sensor generate, store, and/or analyze data, such as process data, using internal control procedures and then provide the data to an RF-responsive transmitter. A process sensor can use a process related and/or non-process related signal to determine when to operate. Alternately, a process sensor can further comprise at least one of a receiver, transmitter, and housing.

In various embodiments, a RF-responsive transmitter comprises a transmitter and an antenna. For example, the transmitter can be configured to modulate and/or encode an input signal with data, such as the process data, and the antenna can be configured to transmit the input signal.

In other cases, an RF-responsive transmitter can comprise a modulator and an antenna, and the modulator can be configured to modulate an input signal with the process data and the antenna can be configured to transmit the modulated signal. Alternately, a RF-responsive transmitter can comprise an antenna and a backscatter modulator.

In 930, a sensor interface assembly (SIA) is provided. A SIA can be provided in a number of different locations in a material processing system. For example, a SIA can be coupled to a chamber, upper assembly, and substrate holder. In other embodiments, a SIA can be installed outside a chamber if a communication link can be established with a RF-responsive process sensor. Alternately, SIA can be coupled to a monitoring port or another input port.

A SIA can comprise a receiver configured to receive a response signal from at least one RF-responsive process sensor, and the response signal can comprise data, such as process data. For example, a RF-responsive process sensor can be configured to generate and transmit a response signal using internal control procedures.

In addition, the SIA can comprise a transmitter configured to transmit an input signal to at least one RF-responsive process sensor, and the input signal can comprise operational data for the at least one RF-responsive process sensor. For example, a RF-responsive process sensor can be configured to generate and transmit a response signal when it receives an input signal from a SIA.

In other cases, the SIA can comprise a power source that can be coupled to the SIA transmitter and SIA receiver. In other embodiments, the SIA can comprise a controller that can be coupled to the SIA transmitter and SIA receiver.

In 940, a RF-responsive process sensor having a process sensor and a RF-responsive transmitter can be used to generate data, such as process data. A process sensor can generate process data before, during, and after a process. For example, RF-responsive process sensors can generate process data for chamber components, upper assembly components, and substrate holder components. In addition, a RF-responsive process sensor can generate process data for a chamber liner (process tube) when one is used in the material processing system. Furthermore, a RF-responsive process sensor can generate process data for a transfer system component, a RF system component, a gas supply system component, and/or an exhaust system component.

A RF-responsive process sensor can be configured to provide one or more component related properties. For example, a process sensor can be configured to generate process data that can comprise at least one of temperature data, pressure data, flow data, and process chemistry data and to provide the process data to a RF-responsive transmitter. Process data can comprise measured and/or processed data that can be used to control a process, process chamber, and/or processing tool. Process data can also be used in installation, operational, and/or maintenance procedures. Process data can include measurements taken before, during, and/or after a process. Alternately, process data can include measurements taken before, during, and/or after a plasma process.

In one or more embodiments, a RF-responsive process sensor can comprise a power source and the power source can be configured to use a process related frequency to cause the RF-responsive process sensor to generate process data. For example, the power source can convert some of the RF energy provided to a process chamber into a DC signal and use the DC signal to operate the process sensor in the RF-responsive process sensor. Alternately, the RF-responsive process sensor can comprise a battery coupled to the process sensor, and the DC signal can be used to cause the process sensor to begin generating process data.

In other embodiments, a RF-responsive process sensor can comprise a power source and the power source can be configured to use a non-plasma related frequency to cause the RF-responsive process sensor to generate process data. For example, the power source can convert some of the RF energy provided by an input signal into a DC signal and use the DC signal to operate the process sensor in the RF-responsive process sensor. Alternately, the RF-responsive process sensor can comprise a battery coupled to the process sensor, and the input signal can be used to cause the process sensor to begin generating process data.

In additional embodiments, a RF-responsive process sensor can be used in a plasma processing system and can be configured to use plasma related and non-plasma related frequencies to generate data such as process data.

In 950, at least one RF-responsive process sensor uses its RF-responsive transmitter to transmit the process data. For example, a RF-responsive transmitter can transmit a response signal that includes data such as the process data. In an alternate embodiment, a RF-responsive transmitter can be coupled to more than one process sensor, and a RF-responsive transmitter can be coupled to one or more additional sensors.

A RF-responsive process sensor can be provided in a number of different locations in a material processing system and can be configured to transmit process data before, during, and/or after a plasma process is performed by the material processing system. For example, RF-responsive process sensors can be coupled to at least one of a chamber component, an upper assembly component, and a substrate holder component and can transmit process data from different locations in the system. In addition, a RF-responsive process sensor can transmit process data from a chamber liner (process tube) when one is used in the material processing system. Furthermore, a RF-responsive process sensor can transmit process data from a transfer system component, a RF system component, a gas supply system component, and/or an exhaust system component.

In some embodiments, a RF-responsive process sensor can comprise a power source, and the power source can be configured to use a plasma related frequency to cause the RF-responsive process sensor to transmit process data. For example, the power source can convert some of the RF energy provided to the process chamber into a DC signal and use the DC signal to operate the transmitter in the RF-responsive process sensor. Also, the RF-responsive process sensor can comprise a battery coupled to the transmitter and can use a process related signal to cause the RF-responsive transmitter to begin transmitting data.

In other embodiments, a RF-responsive process sensor can comprise a power source and the power source can be configured to use a non-process related frequency to cause the RF-responsive process sensor to transmit process data. For example, the power source can convert some of the RF energy provided by an input signal into a DC signal and use the DC signal to operate the transmitter in the RF-responsive process sensor. Also, the RF-responsive process sensor can comprise a battery coupled to the transmitter and can use the input signal to cause the RF-responsive transmitter to begin transmitting data.

Furthermore, the RF-responsive process sensor be used in a plasma processing system and can be configured to transmit a response signal using a plasma related frequency or a non-plasma related frequency when transmitting data such as process data.

In alternate embodiments, a RF-responsive process sensor can comprise a receiver that can be used to receive an input signal. For example, a receiver can be configured to receive an input signal and to use the input signal to generate operational data for controlling the RF-responsive process sensor. Also, the RF-responsive process sensor can use the input signal to determine when to generate data and/or when to transmit data.

In other embodiments, a RF-responsive process sensor can comprise a memory that can be used to store data such as process data. Process data can be stored during part of a process and transmitted during a different part of the process. For example, process data can be stored during a plasma event and transmitted after the plasma event has ended.

In other embodiments, a RF-responsive process sensor can comprise a controller that can be used to control the operation of the RF-responsive process sensor. The controller can comprise operational data and/or receive operational data from an SIA. For example, the controller can be used to determine when to generate and transmit the process data.

In some embodiments, a RF-responsive process sensor can comprise a timer. Timer can comprise at least one of a continuously running timer and a triggered timer, and a triggered timer can be triggered by a process related or a non-process related frequency. For example, a timer can convert RF energy into a DC signal and use the DC signal to operate the timer. In this manner, RF hour data can be generated. Also, a timer can be triggered by an input signal received by the RF-responsive process sensor.

In 960, a SIA can be used to receive a response signal from one or more RF-responsive process sensors, and the response signal can comprise data such as process data. For example, the receiver in the SIA can be configured to receive one or more response signals during an entire process or during part of a process. In some cases, a RF-responsive process sensor can transmit process data when a RF signal is provided to a process chamber.

In addition, a SIA can be used to transmit an input signal to one or more RF-responsive process sensors. For example, the transmitter in the SIA can be configured to transmit one or more input signals during an entire process or during part of a process. In some cases, a RF-responsive process sensor can transmit process data to a SIA when it receives an input signal from the SIA. An input signal, for example, can comprise operational data for the RF-responsive process sensor.

The SIA can use internal and/or external control data to determine when to receive and when to transmit signals. For example, a SIA can be configured to operate before, during, and/or after a process is performed by the material processing system A SIA can be provided at one or more locations in a material processing system and. For example, a SIA can be coupled to at least one of a chamber wall, an upper assembly, and a substrate holder and can receive process data from different locations in the system. In addition, a SIA can receive process data from a RF-responsive process sensor coupled to a chamber liner (process tube) when one is used in the material processing system. Furthermore, a SIA can receive process data from a RF-responsive process sensor coupled to a transfer system component, a RF system component, a gas supply system component, and/or an exhaust system component.

In some embodiments, a SIA can comprise a power source and the power source can be configured to use a plasma related frequency to cause the SIA to operate. For example, the power source can comprise a RF-to-DC converter that can convert some of the RF energy provided to the plasma chamber into a DC signal, and the DC signal can be used to operate the transmitter and/or receiver in the SIA.

In other embodiments, a SIA can comprise a power source and the power source can be configured to use a non-plasma related frequency to cause the SIA to operate. For example, the power source can comprise a RF-to-DC converter that can convert some of the RF energy provided by an external signal into a DC signal, and the DC signal can be used to operate the transmitter and/or receiver in the SIA.

In addition, the power source can be external to the chamber and coupled to the SIA using one or more cables. Also, the power source can comprise a battery.

In 970, the SIA can send data, such as process data, to a controller. In addition, the SIA can preprocess the process data. For example, the SIA can compress and/or encrypt the data. Procedure 900 ends in 980.

The SIA and/or a system controller can be configured to analyze data such as the process data and to use the analysis results to control a process and/or control a processing tool. The SIA and/or a system controller can be configured to compare the process data with target process data, and to use the comparison to control a process and/or control a processing tool. Also, the SIA and/or a system controller can be configured to compare the process data with historical process data, and to use the comparison to predict, prevent, and/or declare a fault. Furthermore, the SIA and/or a system controller can be configured to analyze data such as the process data and to use the analysis results to determine when to perform maintenance on a component.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A material processing system comprising:
   a processing tool, wherein the processing tool includes at least one process chamber;
   a plurality of RF-responsive process sensors coupled to the processing tool, each RF-responsive process sensor being configured to generate process data for the processing tool and transmit the process data; and
   a sensor interface assembly (SIA) configured to receive the process data from at least one RF-responsive process sensor, said SIA being mounted to said at least one process chamber to facilitate reception of the process data transmitted from the plurality of RF-responsive process sensors.

2. The material processing system as claimed in claim 1, wherein the process data comprises at least one of temperature data, pressure data, flow data, and process chemistry data.

3. The material processing system as claimed in claim 1, wherein at least one RF-responsive process sensor comprises:
   a temperature sensor for generating the process data; and
   a RF-responsive transmitter coupled to an antenna for transmitting the process data.

4. The material processing system as claimed in claim 1, wherein at least one RF-responsive process sensor comprises:
   a pressure sensor for generating the process data; and
   a RF-responsive transmitter coupled to a controller for transmitting the process data.

5. The material processing system as claimed in claim 1, wherein at least one RF-responsive process sensor comprises:
   a process sensor for generating the process data; and
   a RF-responsive transmitter coupled to the process sensor for transmitting the process data.

6. The material processing system as claimed in claim 5, wherein the process sensor comprises at least one of a temperature sensor, a pressure sensor, a flow sensor, and a process chemistry sensor.

7. The material processing system as claimed in claim 5, wherein the at least one RF-responsive process sensor further comprises a timer coupled to at least one of the process sensor and the RF-responsive transmitter.

8. The material processing system as claimed in claim 5, wherein the RF-responsive transmitter comprises an antenna configured to transmit a response signal, and a transmitter coupled to the antenna, wherein the transmitter is configured to modulate and/or encode the response signal with the process data.

9. The material processing system as claimed in claim 5, wherein the at least one RF-responsive process sensor further comprises a power source coupled to at least one of the process sensor and the RF-responsive transmitter.

10. The material processing system as claimed in claim 9, wherein the power source comprises at least one of a RF-to-DC converter configured to convert energy emitted from a process related signal into a DC signal, a RF-to-DC converter configured to convert a non-process related signal into a DC signal, a DC-to-DC converter, and a battery.

11. The material processing system as claimed in claim 10, wherein the power source provides the DC signal to the process sensor.

12. The material processing system as claimed in claim 10, wherein the power source provides the DC signal to the RF-responsive transmitter.

13. The material processing system as claimed in claim 5, wherein the at least one RF-responsive process sensor further comprises a controller coupled to at least one of the process sensor and the RF-responsive transmitter.

14. The material processing system as claimed in claim 13, wherein the controller comprises at least one of a microprocessor, a microcontroller, a timer, digital signal processor (DSP), memory, receiver, A/D converter, and D/A converter.

15. The material processing system as claimed in claim 1, wherein at least one RF-responsive process sensor is coupled to a process chamber component.

16. The material processing system as claimed in claim 15, wherein the at least one RF-responsive process sensor comprises:
a process sensor configured to generate process data for the process chamber component; and
a RF-responsive transmitter coupled to the process sensor for transmitting the process data for the process chamber component.

17. The material processing system as claimed in claim 1, further comprising an upper assembly, wherein at least one RF-responsive electrical sensor is coupled to at least one component of the upper assembly.

18. The material processing system as claimed in claim 17, wherein the at least one RF-responsive electrical sensor comprises:
an electrical sensor configured to generate electrical data for the at least one component of the upper assembly; and
a RF-responsive transmitter coupled to the electrical sensor for transmitting the electrical data for the at least one component of the upper assembly.

19. The material processing system as claimed in claim 1, further comprising a substrate holder, wherein at least one RF-responsive process sensor is coupled to the substrate holder.

20. The material processing system as claimed in claim 19, wherein the substrate holder comprises at least one of a chuck, an electrostatic chuck (ESC), a shield, a focus ring, a baffle, and an electrode.

21. The material processing system as claimed in claim 19, wherein the at least one RF-responsive process sensor comprises:
a process sensor configured to generate process data for the substrate holder; and
a RF-responsive transmitter coupled to the process sensor for transmitting the process data for the substrate holder.

22. The material processing system as claimed in claim 19, wherein the at least one RF-responsive process sensor comprises:
a process sensor configured to generate process data for a wafer on the substrate holder; and
a RF-responsive transmitter coupled to the process sensor for transmitting the process data for the wafer.

23. The material processing system as claimed in claim 1, further comprising a ring, wherein at least one RF-responsive process sensor is coupled to the ring.

24. The material processing system as claimed in claim 23, wherein the ring comprises at least one of a focus ring, a shield ring, a deposition ring, an electrode ring, and an insulator ring.

25. The material processing system as claimed in claim 23, wherein the at least one RF-responsive process sensor comprises:
a process sensor configured to generate process data for the ring; and
a RF-responsive transmitter coupled to the process sensor for transmitting the process data for the ring.

26. The material processing system as claimed in claim 1, wherein at least one RF-responsive process sensor comprises:
a process sensor for generating process data;
a RF-responsive transmitter coupled to the process sensor for transmitting the process data; and
a receiver coupled to at least one of the process sensor and the RF-responsive transmitter.

27. The material processing system as claimed in claim 26, wherein the RF-responsive transmitter comprises an antenna and a backscatter modulator.

28. The material processing system as claimed in claim 26, wherein the RF-responsive transmitter comprises an antenna configured to transmit a response signal, and a transmitter coupled to the antenna, wherein the transmitter is configured to modulate and/or encode the response signal with the process data.

29. The material processing system as claimed in claim 28, wherein the RF-responsive transmitter further comprises at least one of a RF-to-DC converter, a DC-to-DC converter, and a battery.

30. The material processing system as claimed in claim 26, wherein the at least one RF-responsive process sensor further comprises at least one power source, the power source producing a DC signal using at least one of a RF-to-DC converter, a DC-to-DC converter, and a battery.

31. The material processing system as claimed in claim 26, wherein the receiver comprises an antenna and processor, the antenna being configured to receive an input signal, the processor being configured to use the input signal to generate operational data, and to use the operational data to control at least one of the RF-responsive transmitter, the receiver, and the process sensor.

32. The material processing system as claimed in claim 31, wherein the receiver further comprises at least one of a RF-to-DC converter configured to convert energy emitted from a process related signal into a DC signal, a RF-to-DC converter configured to convert a non-process related signal into a DC signal, a DC-to-DC converter, and a battery.

33. The material processing system as claimed in claim 26, wherein the at least one RF-responsive process sensor further comprises a controller coupled to at least one of the receiver, the process sensor, and the RF-responsive transmitter.

34. The material processing system as claimed in claim 33, wherein the controller comprises at least one of a microprocessor, a microcontroller, a timer, digital signal processor (DSP), memory, A/D converter, and D/A converter.

35. The material processing system as claimed in claim 1, wherein the at least one RF-responsive process sensor comprises:
a process sensor for generating process data; and
a RF-responsive transceiver coupled to the process sensor for transmitting the process data.

36. The material processing system as claimed in claim 35, wherein the RF-responsive transceiver comprises an antenna configured to transmit a response signal, a transmitter coupled to the antenna, wherein the transmitter is configured to modulate and/or encode the response signal with the process data, a second antenna, receiver, and processor, the second antenna being configured to receive an input signal, the receiver being configured to use the input signal to generate operational data, the processor being configured to use the operational data to control the RF-responsive transceiver.

37. The material processing system as claimed in claim 35, wherein the at least one RF-responsive process sensor further comprises a controller coupled to at least one of the process sensor and the RF-responsive transceiver.

38. The material processing system as claimed in claim 37, wherein the controller comprises at least one of a microprocessor, a microcontroller, a timer, digital signal processor (DSP), timer, memory, A/D converter, and D/A converter.

39. The material processing system as claimed in claim 35, wherein the at least one RF-responsive process sensor further comprises at least one power source coupled to at least one of the process sensor and the RF-responsive transceiver, the at least one power source comprising at least one of a RF-to-DC converter, a DC-to-DC converter, and a battery.

40. The material processing system as claimed in claim 1, wherein the SIA comprises:
   a receiver configured to receive a response signal containing the process data from at least one RF-responsive process sensor; and
   a transmitter configured to transmit an input signal to the at least one RF-responsive process sensor, wherein the input signal causes the at least one RF-responsive process sensor to send the response signal to the receiver.

41. The material processing system as claimed in claim 1, wherein the material processing system further comprises:
   a controller coupled to the SIA, the controller being configured to analyze the process data, wherein the controller compares the process data with target electrical performance data, and to use the comparison to change a process.

42. The material processing system as claimed in claim 1, wherein the material processing system further comprises:
   a controller coupled to the SIA, the controller being configured to analyze the process data, wherein the controller compares the process data with historical process data, and to use the comparison to predict a fault.

43. The material processing system as claimed in claim 1, wherein the material processing system further comprises:
   a controller coupled to the SIA, the controller being configured to analyze the process data, wherein the controller compares the process data with historical process data, and to use the comparison to declare a fault.

44. The material processing system as claimed in claim 1, wherein the material processing system further comprises:
   a controller coupled to the SIA, the controller being configured to provide instructional data to the SIA.

45. The material processing system as claimed in claim 1, wherein the material processing system further comprises:
   a controller coupled to the SIA, the controller being configured to analyze the process data and control the processing tool.

46. The material processing system as claimed in claim 1, further comprising a RF system, wherein a RF-responsive process sensor is coupled to at least one RF system component.

47. The material processing system as claimed in claim 1, further comprising a gas supply system, wherein a RF-responsive process sensor is coupled to at least one gas supply system component.

48. The material processing system as claimed in claim 1, further comprising a transfer system, wherein a RF-responsive process sensor is coupled to at least one transfer system component.

49. The material processing system as claimed in claim 1, further comprising an exhaust system, wherein a RF-responsive process sensor is coupled to at least one exhaust system component.

50. The material processing system as claimed in claim 1, wherein the material processing system further comprises:
   a controller coupled to the SIA, the controller being configured to analyze the process data and to use the analysis results to determine when to perform maintenance on the processing tool.

51. A material processing system comprising:
   a processing tool, wherein the processing tool includes at least one process chamber;
   a plurality of RF-responsive process sensors coupled to a component of the processing tool, a RF-responsive process sensor being configured to generate process data for the processing tool and transmit the process data;
   a sensor interface assembly (SIA) configured to receive the process data from at least one RF-responsive process sensor; and
   a plate, wherein at least one of said plurality of RF-responsive process sensors is coupled to the plate.

52. The material processing system as claimed in claim 51, wherein the plate comprises at least one of an exhaust plate, a baffle plate, an electrode plate, and an insulator plate.

53. The material processing system as claimed in claim 51, wherein the at least one RF-responsive process sensor comprises:
   a process sensor configured to generate process data for the plate; and
   a RF-responsive transmitter coupled to the process sensor for transmitting the process data for the plate.

54. A sensor interface assembly (SIA) comprising:
   a SIA receiver configured to receive process data from an RF-responsive process sensor that generates and transmits the process data for a component in a material processing system;
   a SIA housing configured to contain said SIA receiver and configured to be mounted to said material processing system to facilitate reception of the process data transmitted from the RF-responsive process sensor; and
   a SIA transmitter contained in said SIA housing and configured to transmit a signal to said RF-responsive process sensor.

55. The SIA as claimed in claim 54, further comprising a power source contained in said SIA housing.

56. A plasma processing system comprising:
   a processing tool, wherein the processing tool includes a plasma chamber;
   a plurality of RF-responsive process sensors coupled to the processing tool to generate and transmit process data, wherein at least one RF-responsive process sensor is coupled to the plasma chamber; and
   a sensor interface assembly (SIA) configured to receive the process data from the plurality of RF-responsive process sensors, said SIA being mounted to said plasma chamber to facilitate reception of the process data transmitted from the plurality of RF-responsive process sensors.

57. The plasma processing system as claimed in claim 56, wherein the plasma processing system further comprises:
   a controller coupled to the SIA, the controller being configured to analyze the process data and control the plasma processing system.

58. A method of monitoring a material processing system comprising a processing tool, wherein the processing tool includes at least one process chamber, the method comprising:
   providing a RF-responsive process sensor coupled to the processing tool, wherein the RF-responsive process sensor is configured to generate and transmit process data; and providing a sensor interface assembly (SIA), wherein the SIA is configured to receive the process data from the RF-responsive process sensor, and said SIA being mounted to said at least one process chamber to facilitate reception of the process data transmitted from the RF-responsive process sensor.

59. The method of monitoring a material processing system as claimed in claim 58, the method further comprising:
generating the process data; and
transmitting the process data, wherein the RF-responsive process sensor receives an input signal comprising operational data and uses the operational data to transmit the process data using a response signal.

60. The method of monitoring a material processing system as claimed in claim 58, the method further comprising:
generating process data; and
transmitting the process data, wherein the process data comprises at least one of temperature data, pressure data, flow data, and process chemistry data.

61. The method of monitoring a material processing system as claimed in claim 58, wherein the method further comprises:
coupling at least one RF-responsive process sensor to a chamber component;
generating process data for the chamber component; and
transmitting the process data for the chamber component, wherein the at least one RF-responsive process sensor comprises a process sensor and a RF-responsive transmitter coupled to the process sensor.

62. The method of monitoring a material processing system as claimed in claim 58, wherein the method further comprises:
coupling at least one RF-responsive process sensor to a component of an upper assembly of the material processing system;
generating process data for the component of the upper assembly; and
transmitting the process data for the component of the upper assembly, wherein the at least one RF-responsive process sensor comprises a process sensor and a RF-responsive transmitter coupled to the process sensor.

63. The method of monitoring a material processing system as claimed in claim 58, wherein the method further comprises:
coupling at least one RF-responsive process sensor to a substrate holder;
generating process data for the substrate holder; and
transmitting the process data for the substrate holder, wherein the at least one RF-responsive process sensor comprises a process sensor and a RF-responsive transmitter coupled to the process sensor.

64. The method of monitoring a material processing system as claimed in claim 58, wherein the method further comprises:
coupling at least one RF-responsive process sensor to a wafer;
generating process data for the wafer; and
transmitting the process data for the wafer, wherein the at least one RF-responsive process sensor comprises a process sensor and a RF-responsive transmitter coupled to the process sensor.

65. The method of monitoring a material processing system as claimed in claim 58, wherein the method further comprises:
coupling a RF-responsive process sensor to at least one of a transfer system component, a RF system component, a gas supply system component, and an exhaust system component;
generating process data for the component to which the RF-responsive process sensor is coupled; and
transmitting the process data for the component, wherein the RF-responsive process sensor comprises a process sensor and a RF-responsive transmitter coupled to the process sensor.

66. The method of monitoring a material processing system as claimed in claim 58, wherein the method further comprises:
coupling at least one RF-responsive process sensor to a ring;
generating process data for the ring; and
transmitting the process data for the ring, wherein the at least one RF-responsive process sensor comprises a process sensor and a RF-responsive transmitter coupled to the process sensor.

67. The method of monitoring a material processing system as claimed in claim 66, wherein the ring comprises at least one of a focus ring, a shield ring, a deposition ring, an electrode ring, and an insulator ring.

68. The method of monitoring a material processing system as claimed in claim 58, wherein the method further comprises:
coupling at least one power source to the RF-responsive process sensor, wherein the RF-responsive process sensor comprises a process sensor and a RF-responsive transmitter coupled to the process sensor;
generating a DC signal; and
providing the DC signal to the RF-responsive transmitter and the process sensor.

69. The method of monitoring a material processing system as claimed in claim 68, wherein the method further comprises:
generating the DC signal using at least one of a battery, filter, a RF-to-DC converter, and a DC-to-DC converter.

70. The method of monitoring a material processing system as claimed in claim 58, the method further comprising:
transmitting an input signal using the SIA, the SIA comprising a transmitter, wherein the input signal comprises operational data; and
receiving the process data, wherein the SIA comprises a receiver configured to receive a response signal from the RF-responsive process sensor.

71. The method of monitoring a material processing system as claimed in claim 70, the method further comprising:
generating the process data; and
transmitting the process data, wherein the at least one RF-responsive process sensor receives the input signal and uses the operational data to transmit the process data using the response signal.

72. A method of monitoring a material processing system comprising a processing tool, wherein the processing tool includes at least one process chamber, the method comprising:
providing a RF-responsive process sensor coupled to a component of the processing tool, wherein the RF-responsive process sensor is configured to generate and transmit process data; and providing a sensor interface assembly (SIA), wherein the SIA is configured to receive the process data from the RF-responsive process sensor;

the method further comprising:

coupling the RF-responsive process sensor to a plate; generating process data for the plate; and transmitting the process data for the plate, wherein the RF-responsive process sensor comprises a process sensor and a RF-responsive transmitter coupled to the process sensor.

73. The method of monitoring a material processing system as claim in claim 72, wherein the plate comprises at least one of a baffle plate, an exhaust plate, an electrode plate, and an injection plate.

74. A method of monitoring a material processing system comprising a processing tool, wherein the processing tool includes at least one process chamber, the method comprising:

providing a RF-responsive process sensor coupled to a component of the processing tool, wherein the RF-responsive process sensor is configured to generate and transmit process data; and providing a sensor interface assembly (SIA), wherein the SIA is configured to receive the process data from the RF-responsive process sensor;

the method further comprising:

transmitting an input signal using the SIA, the SIA comprising a transmitter, wherein the input signal comprises operational data;

receiving the input signal, wherein the RF-responsive process sensor comprises a receiver configured to receive the input signal and to obtain the operational data from the input signal;

generating the process data, wherein the RF-responsive process sensor comprises a process sensor configured to generate the process data;

transmitting the process data, wherein the RF-responsive process sensor comprises a transmitter configured to transmit the process data using a response signal; and receiving the process data, the SIA comprising a receiver configured to receive the response signal from the RF-responsive process sensor.

75. The method of monitoring a material processing system as claimed in claim 74, the method further comprising:

transmitting the input signal using the SIA when plasma is not being generated; and receiving the input signal at the RF-responsive process sensor, when plasma is not being generated.

76. The method of monitoring a material processing system as claimed in claim 74, the method further comprising:

generating the process data, when a process is being performed;

transmitting the response signal using the RF-responsive process sensor when plasma is not being generated; and receiving the response signal, when plasma is not being generated.

77. The method of monitoring a material processing system as claimed in claim 74, the method further comprising:

storing the process data, wherein the RF-responsive process sensor comprises a memory configured to store the process data.

78. The method of monitoring a material processing system as claimed in claim 74, the method further comprising:

providing a DC signal, wherein the RF-responsive process sensor comprises a power source configured to produce the DC signal and to provide the DC signal to at least one of the RF-responsive process sensor receiver and the RF-responsive process sensor transmitter.

79. The method of monitoring a material processing system as claimed in claim 78, the method further comprising:

providing a DC signal, wherein the RF-responsive process sensor comprises a power source configured to produce the DC signal by converting at least one plasma related frequency into the DC signal.

80. The method of monitoring a material processing system as claimed in claim 78, the method further comprising:

providing a DC signal, wherein the RF-responsive process sensor comprises a power source configured to produce the DC signal by converting at least one non-plasma related frequency into the DC signal.

81. The method of monitoring a material processing system as claimed in claim 78, the method further comprising:

providing a DC signal, wherein the RF-responsive process sensor comprises a power source configured to produce the DC signal by converting a portion of the input signal into the DC signal.

* * * * *